(12) United States Patent
Hirakawa et al.

(10) Patent No.: US 7,838,801 B2
(45) Date of Patent: Nov. 23, 2010

(54) HEATING APPARATUS, HEATING METHOD, COATING APPARATUS, AND STORAGE MEDIUM

(75) Inventors: Osamu Hirakawa, Koshi (JP); Masami Akimoto, Koshi (JP); Shinichi Hayashi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 925 days.

(21) Appl. No.: 11/707,061

(22) Filed: Feb. 16, 2007

(65) Prior Publication Data

US 2007/0194005 A1    Aug. 23, 2007

(30) Foreign Application Priority Data

Feb. 17, 2006  (JP)  .............. 2006-041208

(51) Int. Cl.
| | |
|---|---|
| H01L 21/68 | (2006.01) |
| B65G 15/10 | (2006.01) |
| B65H 5/02 | (2006.01) |
| F27B 5/06 | (2006.01) |
| F27B 5/12 | (2006.01) |

(52) U.S. Cl. .............. 219/392; 219/390; 219/388; 118/728; 198/817; 198/952; 414/157

(58) Field of Classification Search .............. None
See application file for complete search history.

(56) References Cited

U.S. PATENT DOCUMENTS 4,457,419 A * 7/1984 Ogami et al. ............ 198/345.1

7,628,612 B2 * 12/2009 Otsuka et al. ............ 432/247

FOREIGN PATENT DOCUMENTS

| JP | 59228731 A | * 12/1984 |
|---|---|---|
| JP | 62-017133 | 2/1987 |
| JP | 2004-235469 | 8/2004 |
| JP | 2004-319626 | 11/2004 |

OTHER PUBLICATIONS

Japanese Office Action mailed on Jun. 8, 2010 for Application No. 2006-041208 with English translation.

* cited by examiner

*Primary Examiner*—Joseph M Pelham
(74) *Attorney, Agent, or Firm*—Smith, Gambrell & Russell, LLP

(57) ABSTRACT

A heating apparatus cooling a substrate heated by a hot plate at a cooling position adjacent to the hot plate, capable of achieving a smaller height and reducing an operation time in the apparatus, in which contamination of the substrate by particles or the like is less likely, and the like, are provided. The heating apparatus includes a hot plate for heating a wafer representing a substrate from below, in a heating chamber having a wafer load/unload port. In addition, a wire for transferring the wafer between a cooling position of the substrate adjacent to the load/unload port of the heating chamber (position above a cooling plate) and a position above the hot plate is provided and extends. The wafer is mounted on a gap forming member provided on the wire, and thereafter loaded into the heating chamber.

29 Claims, 12 Drawing Sheets

HEATING APPARATUS, HEATING METHOD, COATING APPARATUS, AND STORAGE MEDIUM

BACKGROUND OF THE INVENTION

1. Field of the Invention

The present invention relates to a heating apparatus for performing heat treatment by positioning a substrate on a hot plate and thereafter cooling the substrate at a cooling position adjacent to the hot plate, a heating method, and a coating apparatus using the heating apparatus, and further relates to a storage medium storing a computer program for performing the heating method.

2. Description of the Background Art

A coating and development apparatus applying a resist to a substrate and developing the exposed substrate has been used as an apparatus for forming a resist pattern on a semiconductor wafer (hereinafter, referred to as "wafer") or a glass substrate for LCD (liquid crystal display) representing the substrate. In this apparatus, a hydrophobic treatment unit for subjecting the surface of the substrate to hydrophobic treatment by bringing the substrate into contact with vapor of a hydrophobic treatment agent while heating the substrate, a heating apparatus for drying a solvent in a resist film or an antireflection coating applied to the surface of the substrate, a heating apparatus for altering quality of the exposed resist film on the surface of the substrate, and the like are incorporated.

The hydrophobic treatment unit or the heating apparatus of such a type (these units or apparatuses are hereinafter simply referred to as "heating apparatus") serves to heat the substrate mounted on a heating plate, for example, at a temperature around 100° C., and a structure combined with a cooling plate for performing cooling immediately after heating of the substrate for a predetermined time period, namely, for performing what is called rough heat removal, has been known (for example, Japanese Patent Laying-Open No. 2004-235469).

FIG. 12 shows an exemplary structure of a heating apparatus for heating a wafer W representing a substrate. The heating apparatus has a housing 10 including a wafer transfer port 10a and a shutter 10b for opening/closing transfer port 10a, a base 11 provided in housing 10, a hot plate 12 for heating wafer W, and a cooling plate 13 for cooling wafer W, that is movable toward hot plate 12 over base 11. In base 11, a gas supply portion 14 is provided on the front side of hot plate 12 and an exhaust portion 15 is provided on the rear side of hot plate 12.

In a space inside base 11, elevator mechanisms 16, 17 for elevating/lowering pins 16a, 17a are provided. As a result of elevation/lowering of pin 16a by means of elevator mechanism 16, wafer W is delivered between an external substrate transfer mechanism (not shown) introduced in housing 10 and cooling plate 13. In addition, as a result of elevation/lowering of pin 17a by means of elevator mechanism 17, wafer W is delivered between hot plate 12 and cooling plate 13. FIG. 12 shows a lid-like top plate 18 that can be elevated/lowered by means of an elevator mechanism 18a.

In such a heating apparatus, initially, hot plate 12 is covered with top plate 18 and heated to a prescribed temperature, and in such a state, wafer W is delivered to cooling plate 13. Thereafter, top plate 18 is elevated, cooling plate 13 is introduced between top plate 18 and hot plate 12, and wafer W is delivered from cooling plate 13 to hot plate 12. Then, cooling plate 13 is returned to a position adjacent to hot plate 12, and top plate 18 is lowered to a position slightly above hot plate 12. In this state, by supplying a gas from gas supply portion 14 while performing evacuation through exhaust portion 15, the space between hot plate 12 and top plate 18 is purged for performing prescribed heat treatment. Wafer W that has been subjected to heat treatment is delivered from hot plate 12 to cooling plate 13 after top plate 18 is elevated, thereafter delivered from cooling plate 13 to the not-shown substrate transfer mechanism, and transferred to the next process.

Meanwhile, in this heating apparatus, for example, such a cooling mechanism that a cooling pipe is provided inside or on a lower surface of cooling plate 13 and a coolant is fed through this cooling pipe is provided. Therefore, cooling plate 13 has a thickness around 10 mm. Accordingly, in order to deliver/receive wafer W to/from cooling plate 13, taking into account the thickness of cooling plate 13 and clearance for delivery of wafer W, a gap of at least 10 mm between hot plate 12 and top plate 18 is necessary.

Thus, the conventional heating apparatus has had a large height, because the up/down pin and the elevator mechanism for elevating/lowering wafer W are necessary, the cooling plate is transferred to above the hot plate, or clearance for delivering wafer W between the hot plate and the cooling plate is necessary.

Meanwhile, in order to suppress increase in an occupied area with increase in the size of a substrate such as wafer W, a coating and development apparatus including treatment units such as heating apparatuses arranged in multiple layers has been commercialized. In such a case, if the heating apparatus has a large height, the number of layers cannot be increased.

In addition, elevation/lowering of top plate 18 or delivery of wafer W between cooling plate 13 and hot plate 12 is necessary in the heating apparatus described above, and a time required for such an operation turns out as an overhead time (operation time) not directly relevant to heat treatment, which results in lower throughput.

Though Japanese Utility Model Laying-Open No. 62-017133 describes an apparatus for transferring a substrate by means of wires, it is silent about a method for solving the above-described problems. In addition, if a wafer is directly mounted on the wires, the wafer is contaminated due to adhesion of particles or the like caused by contact between the wafer and the wires, which leads to lower product yield.

SUMMARY OF THE INVENTION

The present invention was made in view of such circumstances. An object of the present invention is to provide a heating apparatus cooling a substrate heated by a hot plate at a cooling position (for example, a cooling plate) adjacent to the hot plate, capable of achieving a smaller height and reducing an operation time in the apparatus, in which contamination of the substrate by particles or the like is less likely, a coating apparatus incorporating the heating apparatus, a heating method, and a storage medium storing a program for performing the method.

A heating apparatus according to the present invention includes: a heating chamber having a load/unload port of a substrate formed on one side; a hot plate provided in the heating chamber for heating the substrate from below; a plurality of wires provided in a manner extending along a direction of transfer of the substrate and wound around pulleys provided at opposing ends of a transfer path of the substrate, for transferring the substrate between a cooling position of the substrate adjacent to the load/unload port of the heating chamber and a position above the hot plate; a groove portion provided in a surface portion of the hot plate for passage of the wire; and a gap forming member provided on the wire for mounting the substrate, such that the substrate is in a state floating above the surface of the hot plate with a gap therefrom when the substrate is located above the hot plate. The substrate loaded from outside to the cooling position is subjected to heat treatment in the heating chamber and thereafter returned to the cooling position.

In the heating apparatus, preferably, the gap forming member serves to hold the substrate in a state floating above the hot plate with a gap of at most 0.5 mm therefrom. In addition, advantageously, the gap forming member is formed to have a spherical shape and the wire passes through a central portion of the member.

Moreover, advantageously, on the wire, a plurality of restriction members are provided along a contour of the substrate, in order to prevent displacement of the substrate by restricting an outer edge of the substrate. In addition, preferably, the wire is divided at a location on a lower side of the transfer path of the substrate, and an elastic member constantly applying restoring force in a direction of compression is provided between division locations. Further, advantageously, in the heating chamber, a top plate is provided and fixed, opposed to the hot plate, for example, at a distance of at most 6 mm.

In addition, a gas discharge port for discharging a gas may be provided on a load/unload port side of the heating chamber, an exhaust port for exhausting the gas may be provided on a side opposite to the load/unload port of the heating chamber, and when the substrate is subjected to heat treatment, airflow from the gas discharge port toward the exhaust port may be formed. In this case, the gas forming the airflow may be a gas for hydrophobic treatment of a surface of the substrate. Here, for partition of atmosphere between the inside and the outside of the heating chamber, a curtain with a gas or a shutter may be formed at the load/unload port of the heating chamber.

Moreover, in delivery of the substrate from an external substrate transfer mechanism holding a peripheral edge of the substrate to the gap forming member waiting at the cooling position, advantageously, the external substrate transfer mechanism carrying the substrate is introduced to an upper side of the cooling position, moves from the upper side to a lower side of the cooling position while forming a space for passage of a pulley provided at one end of a substrate transfer path between the substrate transfer mechanism and the cooling position, delivers the substrate to the gap forming member, and returns from the lower side of the cooling position.

Here, if a cooling plate is provided at the cooling position, advantageously, a groove portion is provided in a surface portion of the cooling plate for passage of the wire, and when the substrate is located above the cooling plate, the substrate is in a state floating above the surface of the cooling plate with a gap therefrom.

Here, in delivery of the substrate from an external substrate transfer mechanism holding a peripheral edge portion of the substrate to the gap forming member waiting on the cooling plate, preferably, the external substrate transfer mechanism carrying the substrate is introduced to an upper side of the cooling plate, moves from the upper side to a lower side of the cooling plate while forming a space for passage of a pulley provided at one end of the substrate transfer path between the substrate transfer mechanism and the cooling plate, delivers the substrate to the gap forming member, and returns from the lower side of the cooling plate.

In addition, a coating apparatus according to the present invention includes: a carrier load/unload portion accommodating a substrate and loading/unloading a carrier; a coating portion applying coating liquid to a surface of the substrate taken out from the carrier; the heating apparatus characterized as above for performing heat treatment of the substrate for pre-treatment or post-treatment of coating treatment by the coating portion; and a substrate transfer mechanism delivering the substrate to the heating apparatus. In delivery of the substrate to the gap forming member waiting at the cooling position, the substrate transfer mechanism is introduced to an upper side of the cooling position, moves from the upper side to a lower side of the cooling position while forming a space for passage of a pulley provided at one end of a substrate transfer path between the substrate transfer mechanism and the cooling position, delivers the substrate to the gap forming member, and returns from the lower side of the cooling position.

According to the present invention, the substrate is loaded onto the hot plate while it is mounted on the gap forming member provided on the wire and the heat treatment of the substrate is performed in that state. Therefore, an up/down pin and an elevator mechanism for elevating/lowering the substrate are not required, and clearance for delivery of the substrate by means of the up/down pin is not necessary either. Accordingly, the height of the heating apparatus can be suppressed. Consequently, the number of layers of the heating apparatuses installed in the coating apparatus can be increased and treatment performance can be enhanced.

In addition, an operation time required for an elevation/lowering operation of the up/down pin is not necessary, and the overhead time not directly relevant to heat treatment can correspondingly be reduced, thus improving throughput. Moreover, unlike the conventional example, as the cooling plate having a large thickness is not loaded into the heating apparatus, a ceiling portion of the heating chamber can be low and the structure without elevating/lowering the ceiling portion can be adopted. Therefore, by adopting such a structure, the height of the heating apparatus can further be made smaller, and further reduction in the overhead time can be achieved by dispensing with elevation/lowering of the ceiling portion.

Further, the substrate is mounted on the gap forming member and subjected to heat treatment in a state floating above the surface of the hot plate with a gap therefrom. Therefore, as compared with the case of transfer in such a state that the substrate is directly mounted on the wire, adhesion of particles or the like to the surface of the substrate in the heating chamber is less likely. Consequently, the surface of the substrate is not contaminated and the product yield is not lowered. Still further, delivery of the substrate between the external substrate transfer mechanism and the cooling position is performed by elevating/lowering the substrate transfer mechanism while forming a space for passage of the pulley provided at one end of the substrate transfer path between the substrate transfer mechanism and the cooling position. Therefore, the up/down pin for delivery of the substrate is not necessary either at the cooling position.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
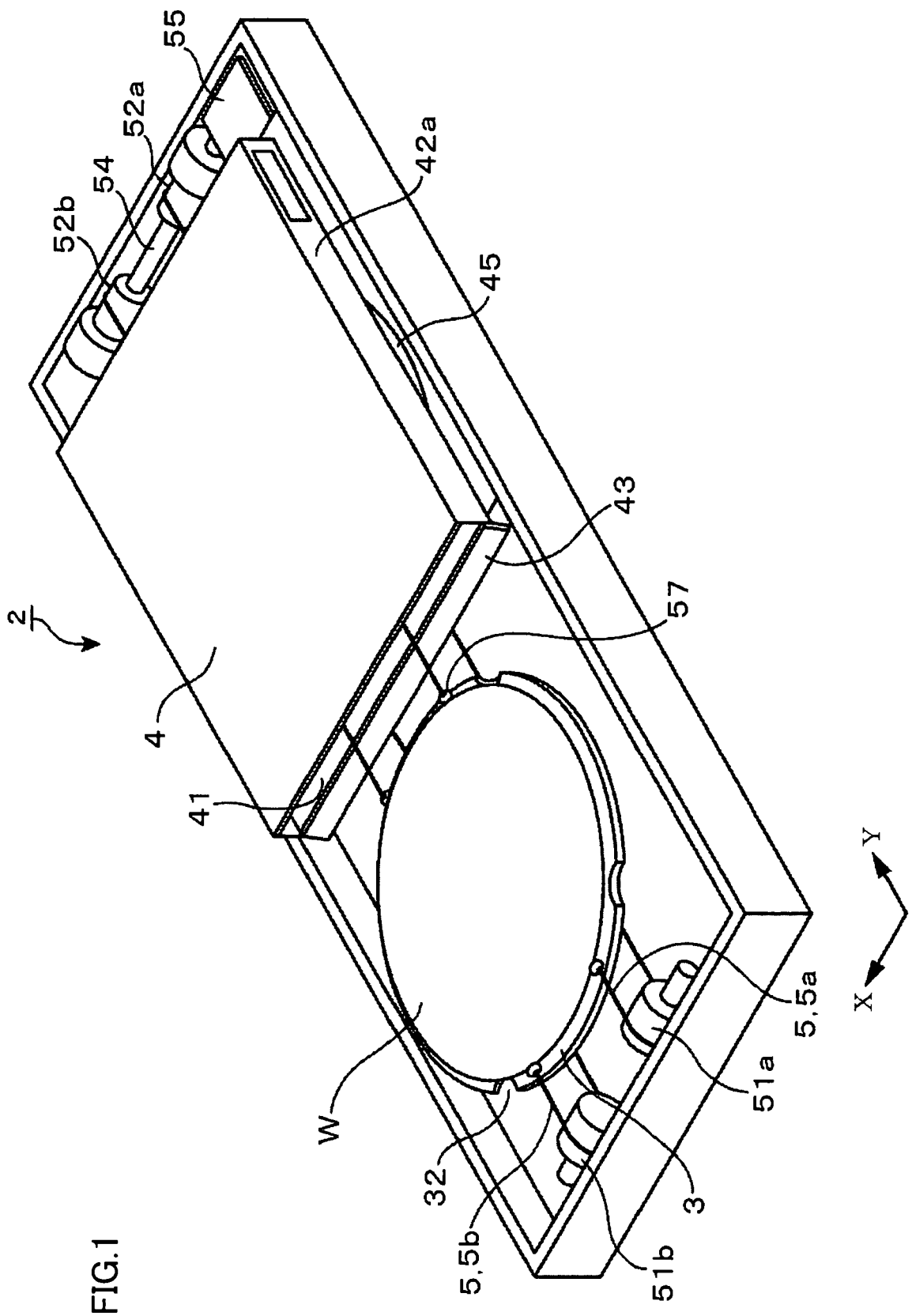
FIG. 1 is a perspective view showing an embodiment of a heating apparatus of the present invention.

A heating apparatus 2 representing an exemplary embodiment of a heating apparatus according to the present invention, which, for example, subjects wafer W representing the substrate to heat treatment in a vapor atmosphere of a hydrophobic treatment agent to attain hydrophobicity of the surface of wafer W, will be described hereinafter with reference to FIGS. 1 to 9B. Here, for example, a 12-inch wafer W is used. As shown in FIG. 2, heating apparatus 2 includes a housing 20 serving as a treatment container, a transfer port 21 of wafer W is provided in a sidewall of housing 20, and a shutter 21a opens/closes transfer port 21. Shutter 21a is provided in order to prevent airflow formed around wafer W as will be described later from being disturbed, due to flow-in of outside air into housing 20 through transfer port 21 during heating of wafer W. In order to prevent the airflow from being disturbed, for example, an air curtain may be provided around transfer port 21 instead of shutter 21a to prevent outside air from entering.

In addition, a base 22 is provided in a lower portion within housing 20. Assuming the side closer to transfer port 21 as the front side, a cooling plate 3 for cooling wafer W is provided on the front side above base 22 with a strut 33 being interposed, and a flat heating chamber 4 for heat treatment of wafer W is provided on the rear side. The side surface facing cooling plate 3 of heating chamber 4 opens as a load/unload port 41 for load/unload of wafer W. Wafer W is transferred by two wires 5 (5a, 5b) between the cooling position on the upper side of cooling plate 3 and the inside of heating chamber 4, and in heating chamber 4, the heat treatment is performed in a state as wafer W is loaded.

Cooling plate 3 is made, for example, of aluminum, and formed to have a substantially annular disk shape with a diameter greater than wafer W. For example, cooling plate 3 is formed to have a thickness around 4 mm, in a region except for a groove portion which will be described later. In addition, cooling plate 3 includes, for example, a not-shown cooling mechanism for feeding temperature-adjusting water on the rear surface side, so that heat of wafer W mounted on cooling plate 3 is roughly removed.

In addition, two wires 5 (5a, 5b) are provided in a manner extending along a direction of transfer of wafer W and wound around two pulleys 51 (51a, 51b) provided at opposing ends of the transfer path along which wafer W is transferred, namely, provided on the front side of cooling plate 3 and the rear side of heating chamber 4, assuming that the side closer to transfer port 21 as the front side. Wire 5 is formed from a heat-resistant material unlikely to be denatured by heat even if wafer W is subjected to heat treatment at a temperature of 250° C. For example, wire 5 is formed from a synthetic fiber such as an aramid fiber (Kevlar manufactured by Du Pont Kabushiki Kaisha, or the like), a ceramic fiber such as a silicon carbide fiber (Nicalon manufactured by Nippon Carbon Co., Ltd., or the like), a carbon fiber (manufactured by Toray Industries Inc., or the like), or the like, and for example a fiber having a diameter around 0.2 mm is used.

Figure 2:
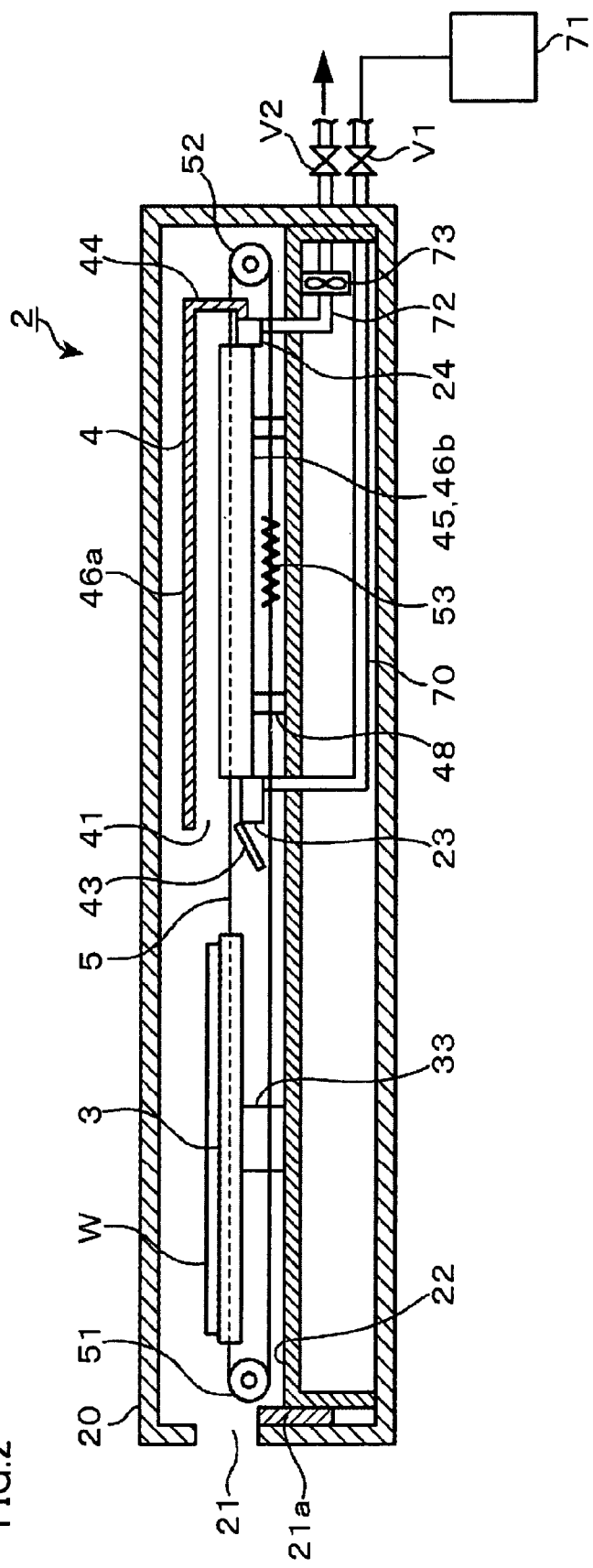
FIG. 2 is a vertical cross-sectional view showing the embodiment.
Figure 3:
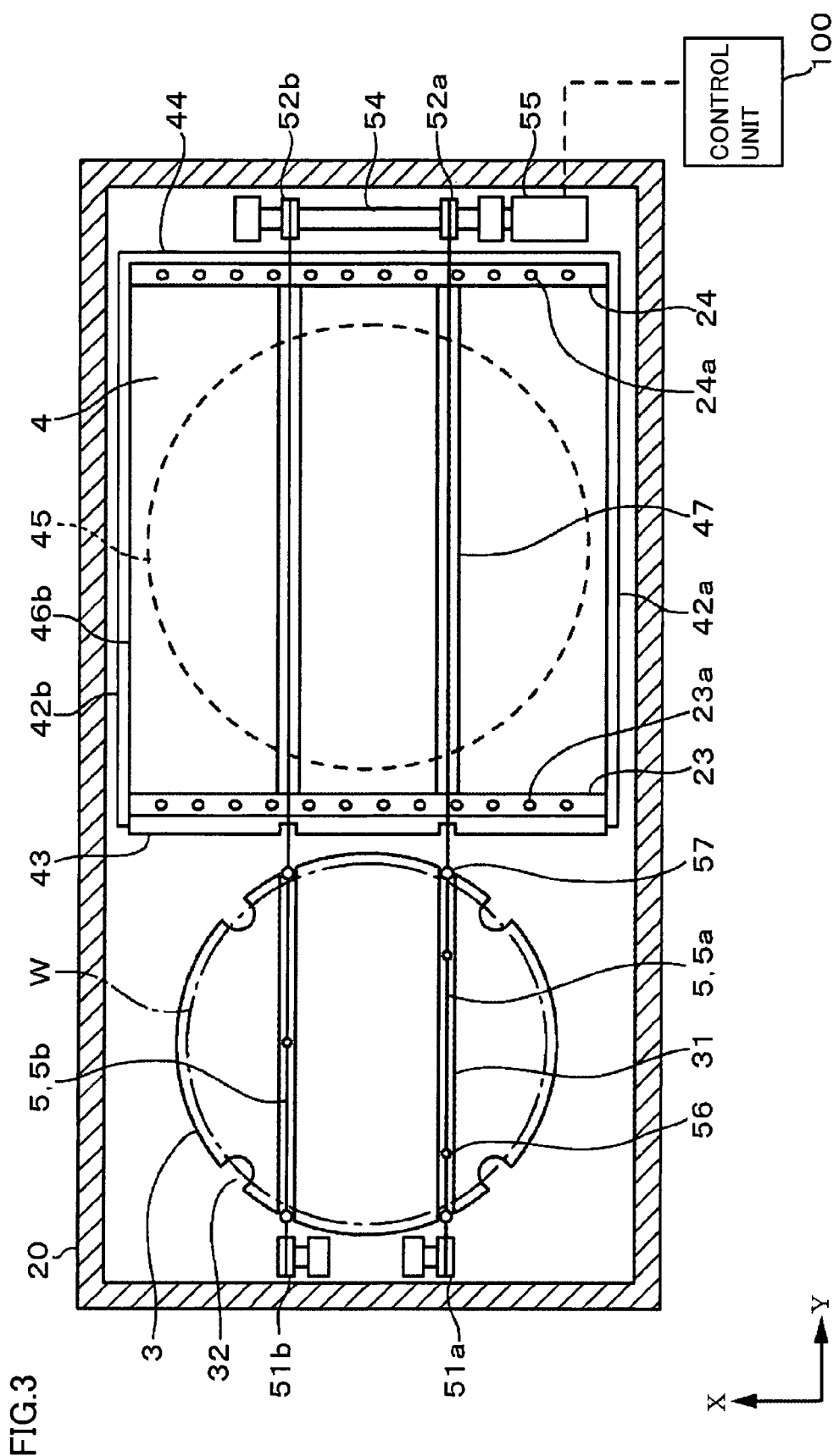
FIG. 3 is a plan view showing the embodiment.

As shown in FIG. 2, wire 5 is divided at a location on the lower side of the transfer path of the substrate and wound around two pulleys 51, 52 with a wire tensioner 53 lying between division locations. Wire tensioner 53 is implemented by an elastic member, such as a tension spring, constantly applying restoring force in a direction of compression between the division locations of wire 5, and serves to maintain an appropriate tension state such that wire 5 is not loosened or stretched even when wafer W is mounted. In addition, as shown in FIG. 3, two pulleys 52a, 52b provided on the rear side of heating chamber 4 are coupled to a motor 55 with a coupling shaft 54 being interposed, and they are capable of rotation in both left and right directions. Motor 55 rotates two pulleys 52a, 52b in the same direction at the same rotation speed based on an instruction from a control unit which will be described later, so that two wires 5a, 5b can move in the same direction at the same speed in synchronization with each other.

Figure 4:
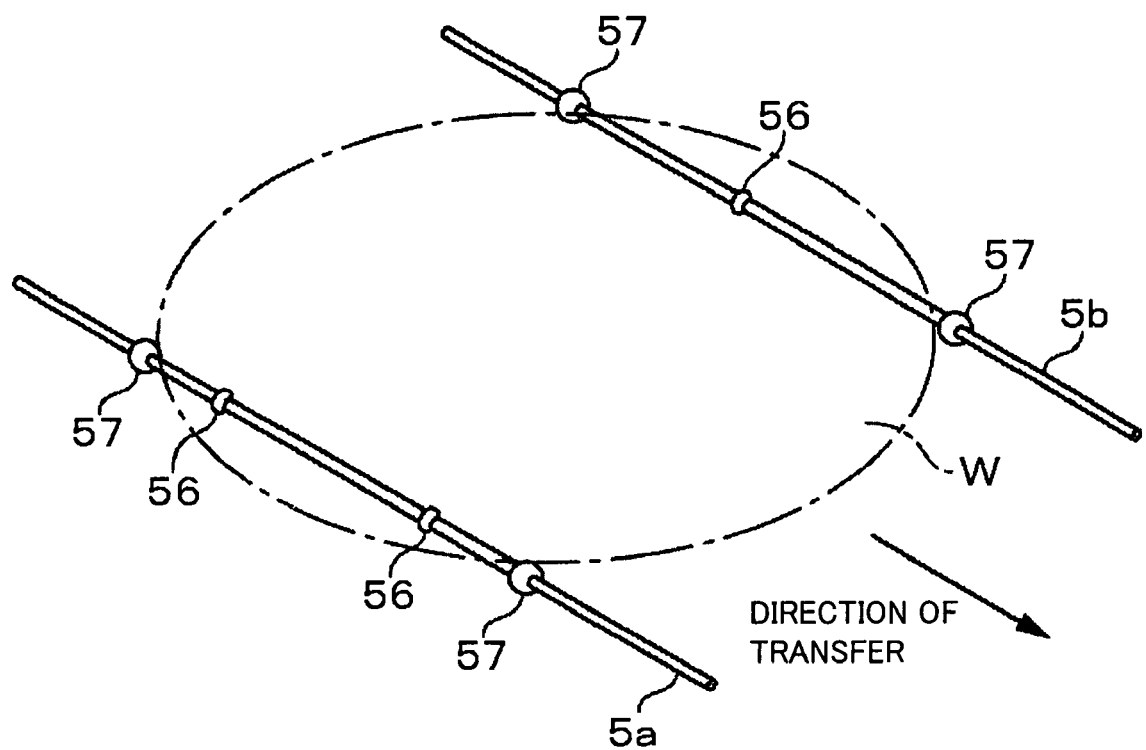
FIG. 4 is a perspective view showing a gap forming member and a restricting member used in the heating apparatus.

In addition, as shown in FIG. 4, each wire 5a, 5b is provided with a gap forming member 56 on which wafer W is mounted and a restricting member 57 for restricting a position at which wafer W is to be mounted. Gap forming member 56 also serves as a mount member on which wafer W is mounted, and implemented, for example, by a heat-resistant bead member having a spherical shape and an identical size. Here, at least three gap forming members 56 are provided on two wires 5, the member having a spherical shape and wire 5 passing through the central portion of gap forming member 56, so that wafer W is supported at three points. As a result, (1) contact area between wafer W and other members can be minimized and (2) wafer W can be kept in parallel to a transfer surface, thereby avoiding direct contact between wafer W and cooling plate 3 or the like.

Moreover, restricting member 57 is also implemented by a heat-resistant, spherical bead member or the like, and two restricting members 57 are provided in each of wires 5a, 5b, for example, in correspondence with four positions along the contour of wafer W as shown in FIG. 4. Then, by mounting wafer W inside restricting members 57, four positions on the peripheral edge of wafer W are determined by restricting members 57 and the mount position of wafer W is not displaced during transfer by means of wires 5a, 5b. It is noted that gap forming member 56 and restricting-member 57 are not shown in FIGS. 2 and 8A-9B for the sake of convenience of illustration.

Moreover, as shown in FIG. 3, two groove portions 31 are provided in cooling plate 3 along wires 5a, 5b, for passage of each wire 5a, 5b or gap forming member 56 or restricting member 57. Here, the size of groove portion 31 and positional relation between wire 5 etc. and groove portion 31 are set such that a gap within 0.5 mm is formed between the lower surface of wafer W and the upper surface of cooling plate 3 as will be described later.

Further, as shown in FIGS. 1 and 3, notch portions 32 are formed, for example, at four points on the peripheral edge portion of cooling plate 3, toward the center of cooling plate 3. Notch portion 32 is necessary in delivering wafer W between the external substrate transfer mechanism and gap forming member 56 waiting on cooling plate 3, as will be described later.

Heating chamber 4 serves to perform heat treatment of wafer W therein, and has an inner space larger than wafer W. Heating chamber 4 is formed, for example, from a heat-conducting material such as aluminum (Al) or stainless steel to have a thickness around 3 mm and a vertical cross-section in a U shape, and opposing sides of load/unload port 41 described previously are also covered with sidewall portions 42 (42a, 42b).

A hot plate 45 made, for example, of aluminum nitride (AlN) or silicon carbide (SiC) is provided on the lower side of heating chamber 4. Hot plate 45 is formed, for example, to have a size substantially the same as wafer W and an annular disk shape, and fixed to a bottom plate 46b by means of a flange or the like. In addition, hot plate 45 (or bottom plate 46b) is supported by a strut 48 and fixed to base 22. Moreover, a distance between hot plate 45 and an upper-side portion of the U-shaped member opposed thereto (hereinafter, referred to as a top plate 46a) is set to at most 6 mm. It is noted that hot plate 45 may be provided also on the upper side where top plate 46a is located, in addition to the lower side of heating chamber 4.

Moreover, a gas discharge portion 23 is provided on the side of load/unload port 41 within heating chamber 4, and an exhaust portion 24 is provided similarly on the rear side. It is noted that gas discharge portion 23 and exhaust portion 24 are not shown in FIG. 1. Gas discharge portion 23 and exhaust portion 24 are provided such that, when wafer W is present in heating chamber 4, they locate on the front side and the rear side respectively with wafer W lying therebetween. Airflow covering a diameter (width) of wafer W and flowing from one end side to the other end side of wafer W between top plate 46a and bottom plate 46b, or unidirectional flow so to speak, can thus be formed.

Figure 5:
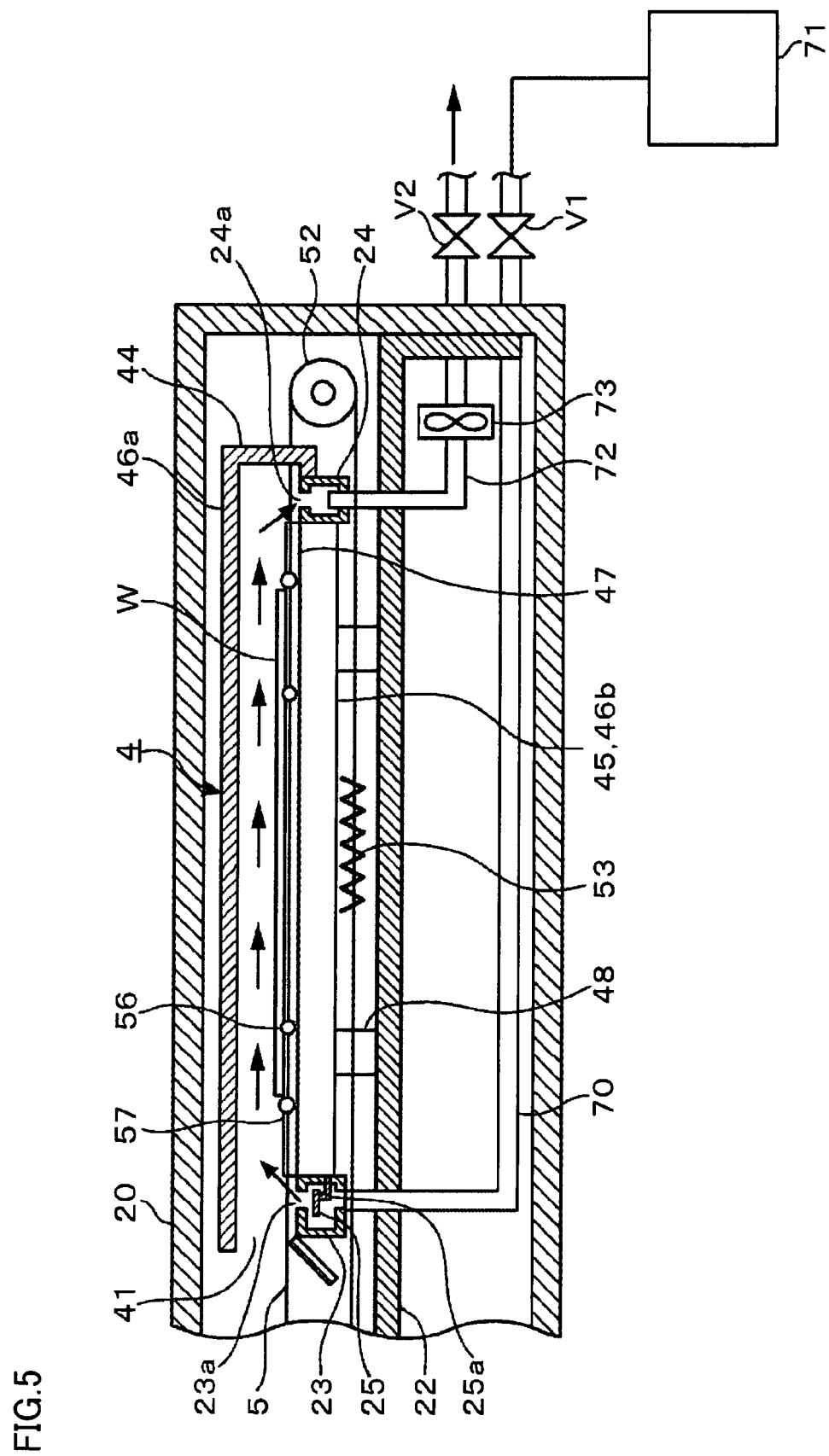
FIG. 5 is a vertical cross-sectional view showing a heating chamber used in the heating apparatus.

As shown in FIG. 3, for example, a large number of small holes are provided in gas discharge portion 23 as discharge ports 23a at regular intervals from each other along a direction of width of housing 20 (X direction in FIG. 3). A length of gas discharge portion 23 from one end to the other end is set to cover the diameter of wafer W mounted in heating chamber 4. As shown in FIGS. 2 and 5, gas discharge portion 23 is connected, for example, to a gas supply source 71 provided outside housing 20, with a gas supply pipe 70 and a valve V1 being interposed. For example, HMDS (hexamethyldisilazane) for hydrophobic treatment of the surface of wafer W is stored in gas supply source 71. HMDS is vaporized by a not-shown vaporizer or the like and supplied to gas discharge portion 23.

Moreover, shutter 43 for partition of an atmosphere between the inside and the outside of heating chamber 4 is attached to load/unload port 41 of heating chamber 4. Shutter 43 is pivotably supported such that one side thereof is shared with the lower side of load/unload port 41, and a not-shown drive portion causes shutter 43 to pivot around this axis so as to open/close load/unload port 41. For example, as shown in FIG. 3, a notch is provided in shutter 43 so that shutter 43 does not interfere with wire 5 when it opens/closes. It is noted that the notch is not shown in FIG. 1. Here, a method of partition of the atmosphere between the inside and the outside of heating chamber 4 is not limited to use of shutter 43. For example, a curtain with a gas may be formed at load/unload port 41. Alternatively, the shutter or the curtain formed by a gas may not be provided at load/unload port 41.

In addition, a rear wall portion 44 is provided in a surface opposed to load/unload port 41, and holes through which wires 5a, 5b passes are provided in rear wall portion 44.

As shown in FIG. 5, a heat-conducting plate 25 is provided in gas discharge portion 23 along a direction of width, and for example, one ends of a plurality of heat pipes 25a are connected to heat-conducting plate 25 at intervals from each other along the direction of width of wafer W. The other end of each heat pipe 25a is connected to hot plate 45. A temperature of a purging gas supplied from gas supply source 71 to the inner space in gas discharge portion 23 through gas supply pipe 70 is adjusted by heat-conducting plate 25 to a level as high as the heating temperature of wafer W (the surface temperature of wafer W when heated), and the purging gas of which temperature has been adjusted is discharged from discharge port 23a. It is noted that means for heating the purging gas may be, for example, a heater provided around an outlet of gas supply pipe 70.

Exhaust portion 24 is provided to oppose to gas discharge portion 23, with hot plate 45 being interposed. As shown in FIG. 3, for example, a large number of small holes are provided in exhaust portion 24 as exhaust ports 24a, at regular intervals from each other along a direction of width of heating chamber 4. A length from one end to the other end of exhaust ports 24a is set, for example, to cover the diameter of wafer W. As shown in FIGS. 2 and 5, an exhaust pipe 72 is connected to exhaust portion 24. Exhaust pipe 72 extends outside housing 20 and an end portion thereof is connected, for example, to an exhaust path of a factory. In addition, a fan 73 is interposed in exhaust pipe 72. By controlling the rotation speed of fan 73, exhaust portion 24 can exhaust the gas in housing 20 through exhaust port 24a, for example, at a predetermined rate of exhaust. In the drawing, a valve V2 is a valve interposed in exhaust pipe 72.

Here in the present invention, as the already-described unidirectional flow should only be formed by gas discharge portion 23 and exhaust portion 24, gas discharge portion 23 and exhaust portion 24 are not limited to those in the present embodiment. In addition, the shape of discharge port 23a and exhaust port 24a is not limited to that in this embodiment; for example, the ports may be provided as slits along the direction of width.

Figure 6A:
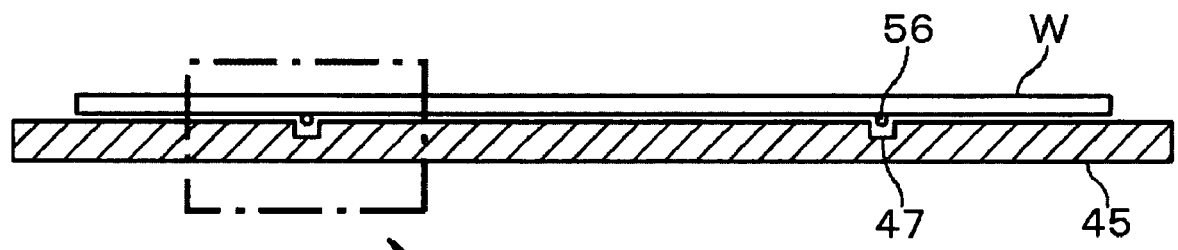
FIG. 6A is a side view showing a state where a wafer is mounted on the gap forming member in the heating chamber.
Figure 6B:
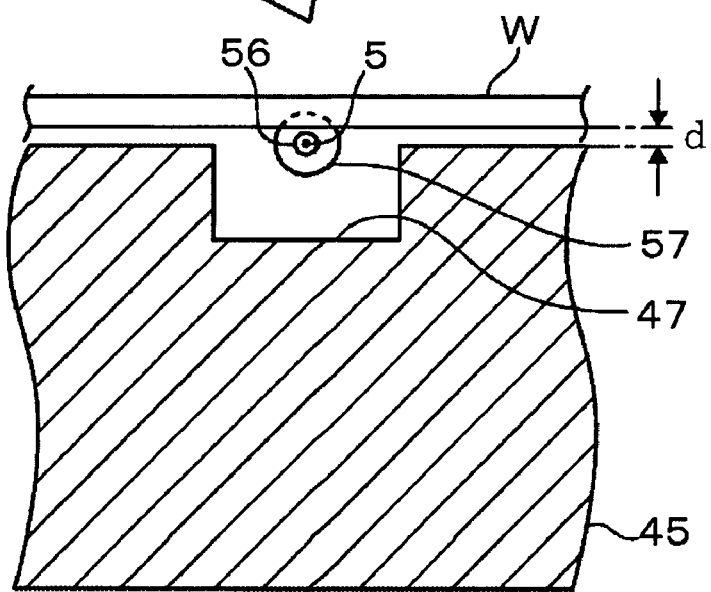
FIG. 6B is an enlarged view showing the state where the wafer is mounted on the gap forming member in the heating chamber.

As shown in FIG. 3, in hot plate 45 and bottom plate 46b (plate portion around hot plate 45), two groove portions 47 for passage of each wire 5a, 5b or gap forming member 56 or restricting member 57 are provided along wires 5a, 5b. As shown in FIG. 6A, in heating chamber 4, wafer W is held above the hot plate in a state mounted on gap forming member 56. Then, as shown in FIG. 6B, positional relation between wire 5 or restricting member 57 and groove portion 47 is adjusted such that the bottom surface of wafer W is in a state floating above the surface of hot plate 45 with a gap d within 0.5 mm therefrom.

As to groove portion 31 formed in cooling plate 3 described previously as well, adjustment is made such that, when wafer W is located above cooling plate 3, a state similar to that attained when wafer W is located above hot plate 45 is attained (a state where wafer W is in a state floating above the surface of cooling plate 3 with a gap within 0.5 mm therefrom).

According to the structure above, wafer W loaded in heating chamber 4 is heated to a predetermined process temperature, by radiation from hot plate 45, convection heat conduction in a gap between wafer W and hot plate 45, and heat conduction from heated HMDS vapor that flows along the surface of wafer W.

Figure 7A:
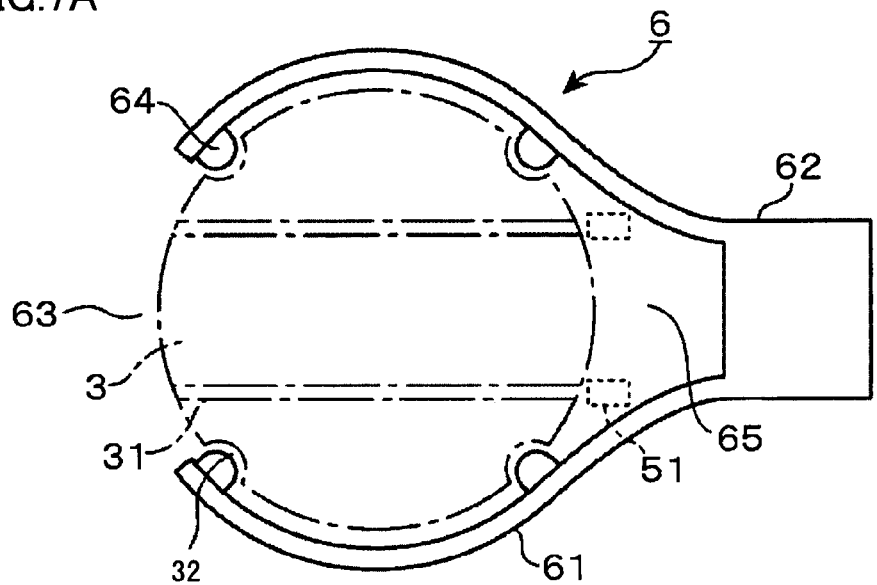
FIG. 7A is a plan view showing an external substrate transfer mechanism for transferring the wafer to the heating apparatus and a cooling plate provided in the heating apparatus.
Figure 7B:
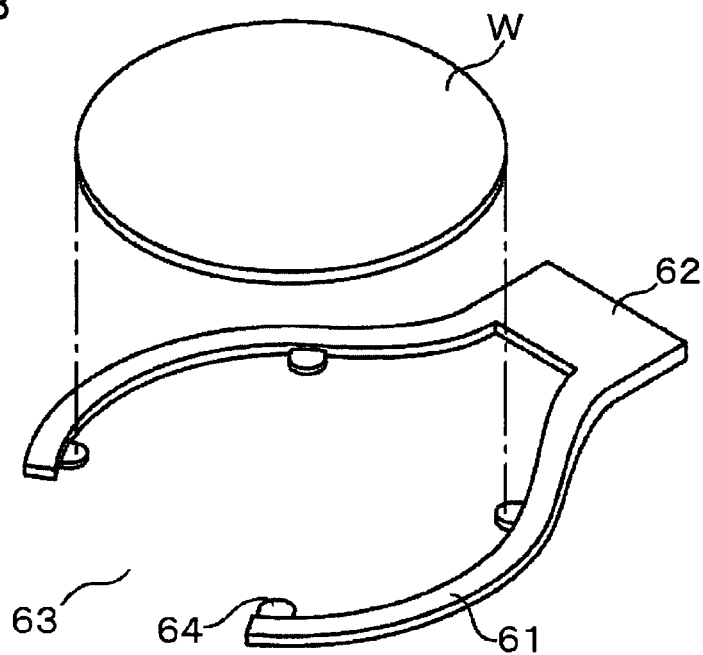
FIG. 7B is a perspective view of the external substrate transfer mechanism for transferring the wafer to the heating apparatus and the cooling plate provided in the heating apparatus.
Figure 7B:
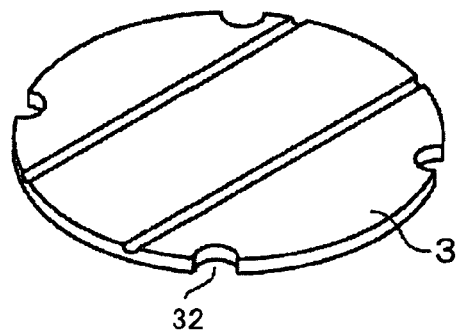

An external substrate transfer mechanism 6 delivering wafer W to gap forming member 56 serving as the mount member will now be described. For example, as shown in FIGS. 7A and 7B, substrate transfer mechanism 6 has a transfer arm 61 in a horseshoe shape extending horizontally in a direction of transfer of wafer W. An inner circumference of transfer arm 61 is formed to have a size slightly greater than the diameter of cooling plate 3, and for example, four protrusions 64 protruding inward are provided in the lower portion of the inner circumference. As shown in FIG. 6B, the peripheral edge portion of wafer W is held by these protrusions 64.

Transfer arm 61 is structured to be able to freely move upward/downward and forward/backward, for example, by means of a not-shown drive mechanism, with a transfer base element 62 being interposed. In delivering wafer W from transfer arm 61 to gap forming member 56, initially, gap forming member 56 or restricting member 57 is set to a home position (a position where wafer W is located on the upper side of cooling plate 3 while wafer W is mounted on wire 5), and transfer arm 61 holding wafer W is introduced to the upper side of cooling plate 3. Here, notch portions 32 in the outer circumference of cooling plate 3 are provided at positions corresponding to respective protrusions 64 of transfer arm 61. Therefore, as shown in FIG. 7B, transfer arm 61 lowers in such a manner as covering cooling plate 3 from above and passes through to the lower side of cooling plate 3, so that wafer W on transfer arm 61 can be delivered to gap forming member 56 waiting on cooling plate 3. Here, as shown in FIG. 7A, in a region surrounded by a base portion of transfer arm 61 and cooling plate 3, such a space as allowing passage of pulley 51 is formed (hereinafter, referred to as a space portion 65). Thus, wafer W can be delivered to gap forming member 56 without interference between transfer arm 61 and pulley 51. In addition, transfer arm 61 that has delivered wafer W pulls back to the front side as a front opening portion 63 passes strut 33 supporting cooling plate 3 or pulley 51, and goes out of housing 20.

Positional relation between component members in heating apparatus 2 will now be described. In this example, wafer W translates on the transfer path. Therefore, position in terms of height of heating chamber 4 is set such that wafer W mounted on gap forming member 56 at the home position enters heating apparatus 2 in that state, and wafer W is subjected to hydrophobic treatment representing the heat treatment while wafer W is in a state floating above the surface of hot plate 45 with a gap within 0.5 mm therefrom.

In addition, in delivering wafer W between gap forming member 56 waiting on cooling plate 3 and external substrate transfer mechanism 6, as described already, transfer arm 61 is introduced to the upper side of cooling plate 3, and thereafter returns from the lower side of cooling plate 3. Accordingly, the size of transfer port 21 or thickness of strut 33 is set to allow such an operation. Namely, transfer port 21 is formed to have such a size as allowing introduction of substrate transfer mechanism 6 and passage of the same from the upper side toward the lower side of cooling plate 3, and strut 33 is formed to have such a thickness as allowing passage of opening portion 63 around strut 33 when substrate transfer mechanism 6 returns. In addition, as described previously, the size or the position of protrusions 64 of transfer arm 61 is also set such that protrusions 64 can pass through notch portion 32 of cooling plate 3.

The control unit provided in heating apparatus 2 will now be described. Motor 55 or a drive portion or the like for shutter 43 is connected to a control unit 100 serving as control means, so that a direction and a distance of travel of wire 5, timing to open/close load/unload port 41, and the like can be controlled. Control unit 100 is provided, for example, in the coating and development apparatus to which heating apparatus 2 is applied. Control unit 100 has a program storage unit implemented, for example, by a computer, and the program storage unit stores a computer program implemented, for example, by software, including steps (commands) such that an action of the overall coating and development apparatus including an action of heating apparatus 2, specifically transfer of wafer W by the substrate transfer mechanism, coating and heat treatment of wafer W by the coating and development apparatus, gas supply control in the housing of a treatment portion and each unit, or the like, is performed. As a result of reading of the computer program by control unit 100, control unit 100 controls the action of the overall coating and development apparatus including the action of heating apparatus 2 which will be described later. It is noted that the computer program is stored in the program storage unit, in a state stored in a storage medium such as a hard disk, a compact disc, a magneto-optical disc, and a memory card.

Figure 8A:
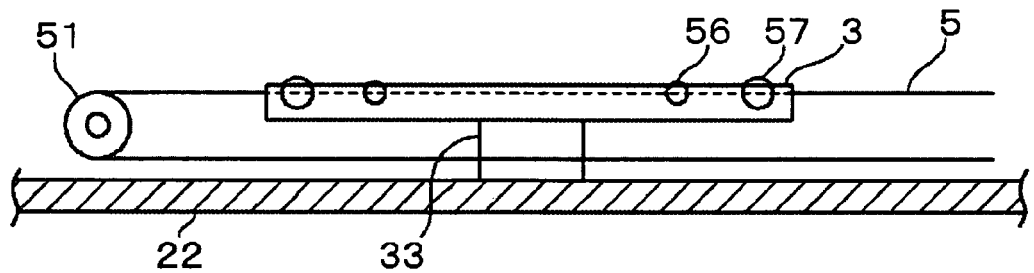
FIGS. 8A-8D are diagrams of a first step for illustrating an action of the heating apparatus.
Figure 8B:
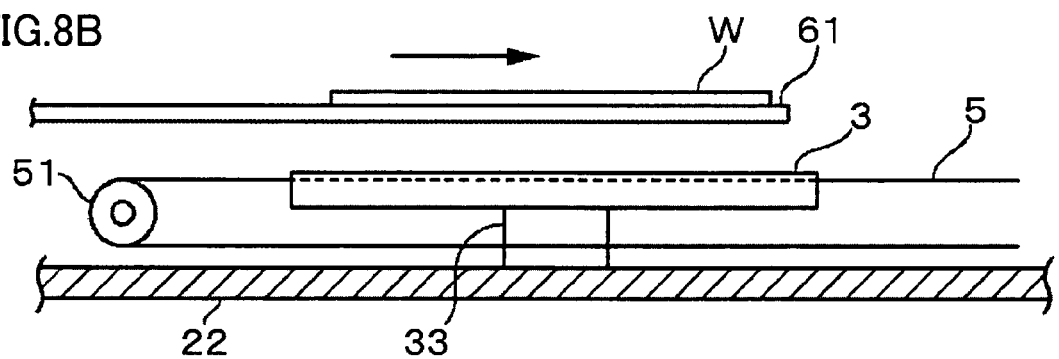
Figure 8C:
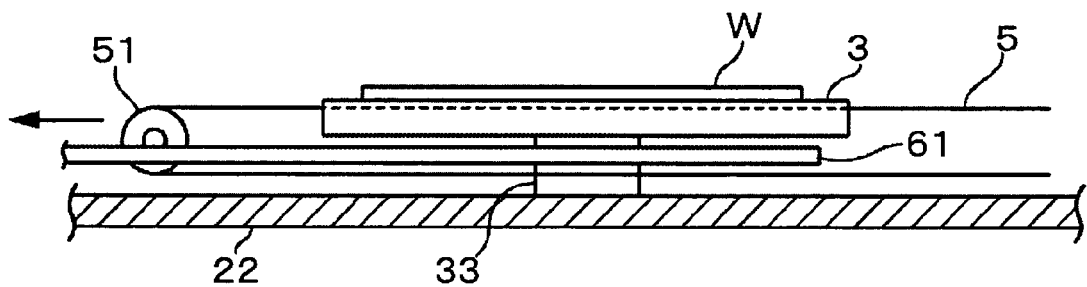
Figure 8D:
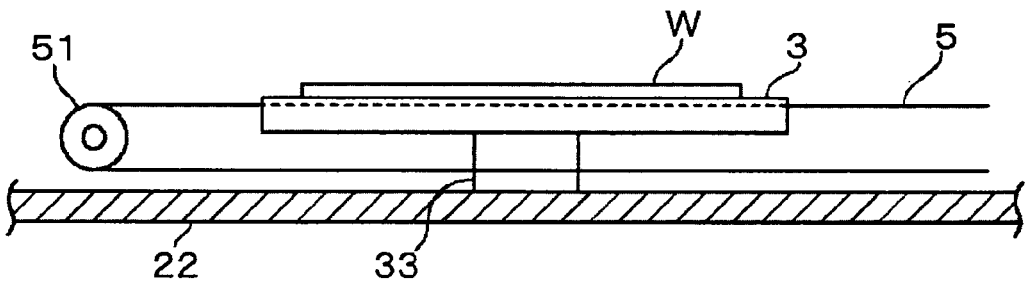

The action of heating apparatus 2 will now be described. Initially, external substrate transfer mechanism 6 loads wafer W, to be subjected to hydrophobic treatment, into housing 20 through transfer port 21, and delivers wafer W to gap forming member 56 waiting at the home position. Namely, as shown in FIG. 8A, control unit 100 initially causes gap forming member 56 to wait at the home position above cooling plate 3. Thereafter, as shown in FIGS. 8B and 8C, transfer arm 61 holding wafer W is introduced to the upper side of cooling plate 3 and then lowered, so as to deliver wafer W to gap forming member 56. Here, space portion 65 for passage of pulley 51 is formed between cooling plate 3 and a portion on the side of transfer base element 62 of transfer arm 61, and transfer arm 61 lowers toward the lower side of cooling plate 3 without interfering with pulley 51. In succession, as shown in FIG. 8C, transfer arm 61 pulls back as opening portion 63 passes strut 33 or pulley 51. Through the operation above, as shown in FIG. 8D, wafer W is positioned such that its peripheral edge portion is located inside each restricting member 57 and mounted on gap forming member 56 in a manner floating above the surface of cooling plate 3 with a gap within 0.5 mm therefrom. In the drawings following FIG. 8B, for the sake of convenience of illustration, gap forming member 56, restricting member 57, and a gap formed between wafer W and the surface of cooling plate 3 are not shown.

Figure 9A:
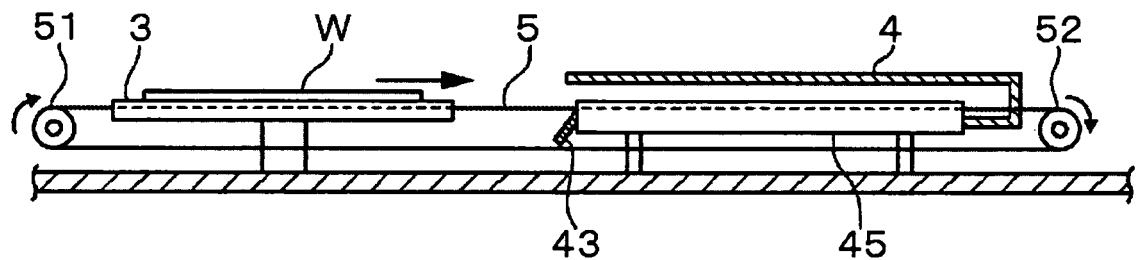
FIGS. 9A and 9B are diagrams of a second step for illustrating an action of the heating apparatus.

Thereafter, as shown in FIG. 9A, control unit 100 causes motor 55 to rotate pulley 52 so as to move wire 5. Then, gap forming member 56 carrying wafer W is moved toward heating chamber 4 to transfer wafer W into heating chamber 4, and thereafter the wafer is stopped above hot plate 45. Wafer W is held in heating chamber 4 in a state floating above the surface of hot plate 45 with a gap within 0.5 mm therefrom. Heating chamber 4 is heated by hot plate 45 by the time of transfer of wafer W, and the temperature in heating chamber 4 is set, for example, to approximately 100° C. In each of FIGS. 9A-9B as well, gap forming member 56, restricting member 57, a gap formed between wafer W and hot plate 45, gas discharge portion 23, exhaust portion 24, and the like are not shown.

Figure 9B:
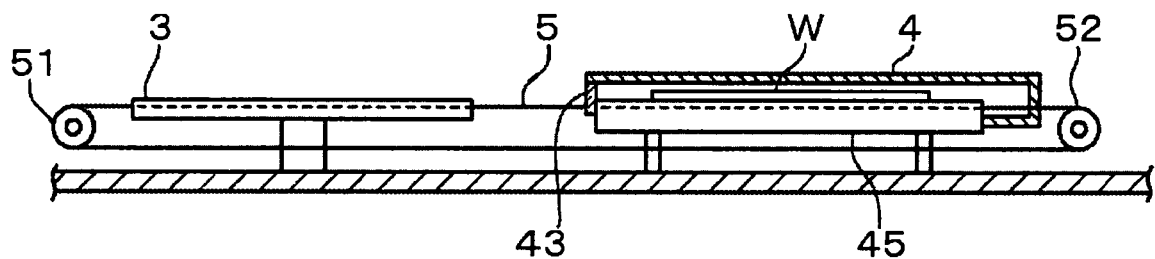

When wafer W is loaded into heating chamber 4, as shown in FIG. 9B, control unit 100 causes shutter 43 to pivot so as to close load/unload port 41, thereby partitioning the atmosphere between the inside and the outside of heating chamber 4. Then, valve V1 is opened and HMDS vapor is supplied from gas supply source 71 to gas supply pipe 70. The HMDS vapor is heated to approximately 100° C. at gas discharge portion 23, and discharged from discharge port 23a toward top plate 46a of heating chamber 4. Substantially simultaneous with start of supply of the HMDS vapor, control unit 100 causes valve V2 to open and fan 73 to rotate, thereby starting exhaust from exhaust portion 24. Thus, as shown with an arrow in FIG. 5, the HMDS vapor supplied from gas discharge portion 23 flows from the front side to the rear side between top plate 46a of heating chamber 4 and hot plate 45, and passes along the periphery of wafer W. Thereafter, the HMDS vapor flows into exhaust portion 24, passes through exhaust pipe 72, and is exhausted outside housing 20. The heated DS vapor thus passes over and comes in contact with the surface of wafer W heated by hot plate 45, so that the surface of wafer W is subjected to hydrophobic treatment. Control unit 100 stops supply of the HMDS vapor from gas discharge portion 23 and exhaust from exhaust portion 24, for example, after the hydrophobic treatment of wafer W is performed for a certain period of time.

Thereafter, control unit 100 causes shutter 43 to open and pulley 52 to rotate so as to move wire 5 and to stop gap forming member 56 at the home position on cooling plate 3. Then, wafer W is cooled in a floating state, with a gap of approximately 0.5 mm lying between the surface of cooling plate 3 and wafer W, thereby roughly removing the heat of wafer W. After the heat is roughly removed, wafer W is delivered to external substrate transfer mechanism 6 and wafer W that has been subjected to hydrophobic treatment is transferred out of heating apparatus 2.

Here, delivery of wafer W from gap forming member 56 to substrate transfer mechanism 6 is carried out in a manner reverse to delivery of wafer W from substrate transfer mechanism 6 to gap forming member 56. Namely, control unit 100 introduces transfer arm 61 holding nothing to the lower side of cooling plate 3, and then elevates transfer arm 61 toward the upper side of cooling plate 3, whereby wafer W is taken from gap forming member 56 onto transfer arm 61 and transfer arm 61 holding wafer W returns from the upper side of cooling plate 3.

Figure 12:
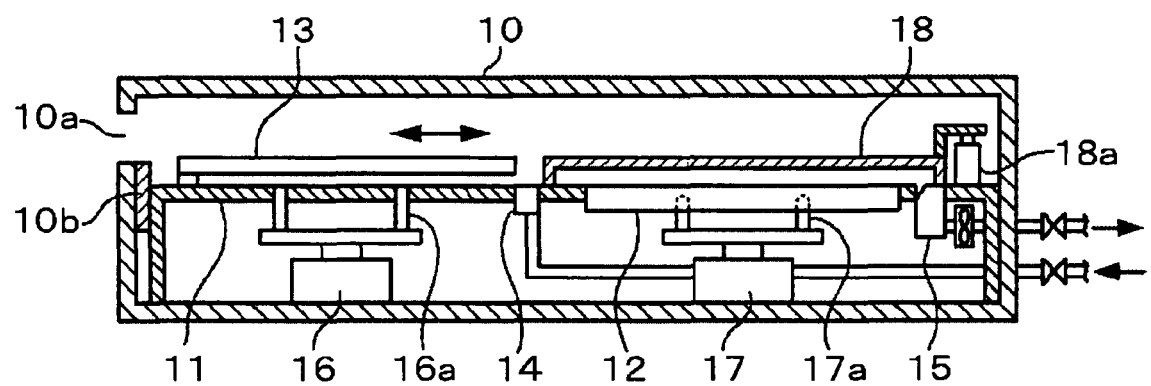
FIG. 12 is a cross-sectional view showing a conventional heating apparatus.

In heating apparatus 2 according to the present embodiment, wafer W in a state mounted on gap forming member 56 serving as the mount member is loaded into heating chamber 4 and in that state wafer W is subjected to heat treatment. Therefore, unlike the conventional technique described in connection with FIG. 12, the up/down pin is not used in the delivery operation of the substrate between hot plate 45 and cooling plate 3. Accordingly, clearance for delivery of wafer W between hot plate 45 and cooling plate 3, or the up/down pin or the elevator mechanism for elevating/lowering the substrate is not required, and the height of the heating apparatus can be suppressed. Consequently, the number of layers of the heating apparatuses installed in the coating and development apparatus can be increased and treatment performance can be enhanced.

In addition, an operation time required for the elevation/lowering operation of the up/down pin is not necessary, and the overhead time not directly relevant to heat treatment can correspondingly be reduced, thus improving throughput. Moreover, unlike the conventional example, as the cooling plate having a large thickness is not loaded into the heating apparatus, a ceiling portion of heating chamber 4 (top plate 46a) can be low and the structure without elevating/lowering the ceiling portion can be adopted. Therefore, by adopting such a structure, the height of heating apparatus 2 can further be made smaller, and further reduction in the overhead time can be achieved by dispensing with elevation/lowering of the ceiling portion.

Further, wafer W is mounted on gap forming member 56 and subjected to heat treatment in a state floating above the surface of hot plate 45 with a gap therefrom. Therefore, as compared with the case of transfer in such a state that wafer W is directly mounted on the wire, adhesion of particles or the like to the rear surface of wafer W in heating chamber 4 is less likely. Still further, delivery of wafer W between external substrate transfer mechanism 6 and cooling plate 3 is performed by elevating/lowering substrate transfer mechanism 6 while forming space 65 for passage of pulley 51 provided at one end of the substrate transfer path between substrate transfer mechanism 6 and cooling plate 3. Therefore, the up/down pin for delivery of wafer W is not necessary either at cooling plate 3.

In addition, in heating apparatus 2, as delivery of wafer W from gap forming member 56 to hot plate 45 is not performed, disturbance of airflow within heating chamber 4 can be prevented. As described already, in the conventional heating apparatus, delivery of wafer W from cooling plate 13 to hot plate 12 has been carried out through a series of operations, for example, by elevating/lowering elevator mechanism 17, and disturbance of airflow has been caused also by this operation (see FIG. 12). In heating apparatus 2 according to the present embodiment, such a delivery operation is not performed. Therefore, disturbance of the airflow as well as scattering of particles or adhesion of particles to wafer W can be prevented.

Moreover, the drive mechanism for elevating/lowering the lid element or delivering wafer W to the hot plate, that has been required in the conventional heating chamber, is no longer necessary. Accordingly, the drive system is simplified and control is facilitated. Further, instead of delivery of wafer W using a support pin between the external substrate transfer mechanism and the cooling plate, wafer W is directly delivered from substrate transfer mechanism 6 to gap forming member 56. Therefore, in this regard as well, control is facilitated.

In the present embodiment, an example where cooling plate 3 is provided before heating chamber 4 has been described, however, the heating apparatus to which the present invention is applied is not limited thereto. For example, a heating apparatus may be such that cooling plate 3 is not present at the position where cooling plate 3 is provided in FIG. 1 and for example natural cooling is carried out at the cooling position. In addition, the number of wires 5 is not limited to two as shown in the embodiment, and three or more wires may be provided and extended, taking into account stability or the like during transfer of wafer W.

In addition, in the present embodiment, hydrophobic treatment of wafer W has been illustrated as a specific example of the heat treatment for wafer W, however, the heat treatment is not limited thereto. For example, the present invention may be applied to a heating apparatus where wafer W, to which resist liquid or an agent for forming an antireflection coating is applied as a coating liquid, is subjected to heat treatment to volatilize a solvent, thereby forming the resist film or the antireflection coating on the surface of wafer W, or to a heating apparatus for heat treatment to be performed before and after development treatment. In such a case, a shutter or a curtain formed by a gas may not be present at an inlet portion of load/unload port 41.

Figure 10:
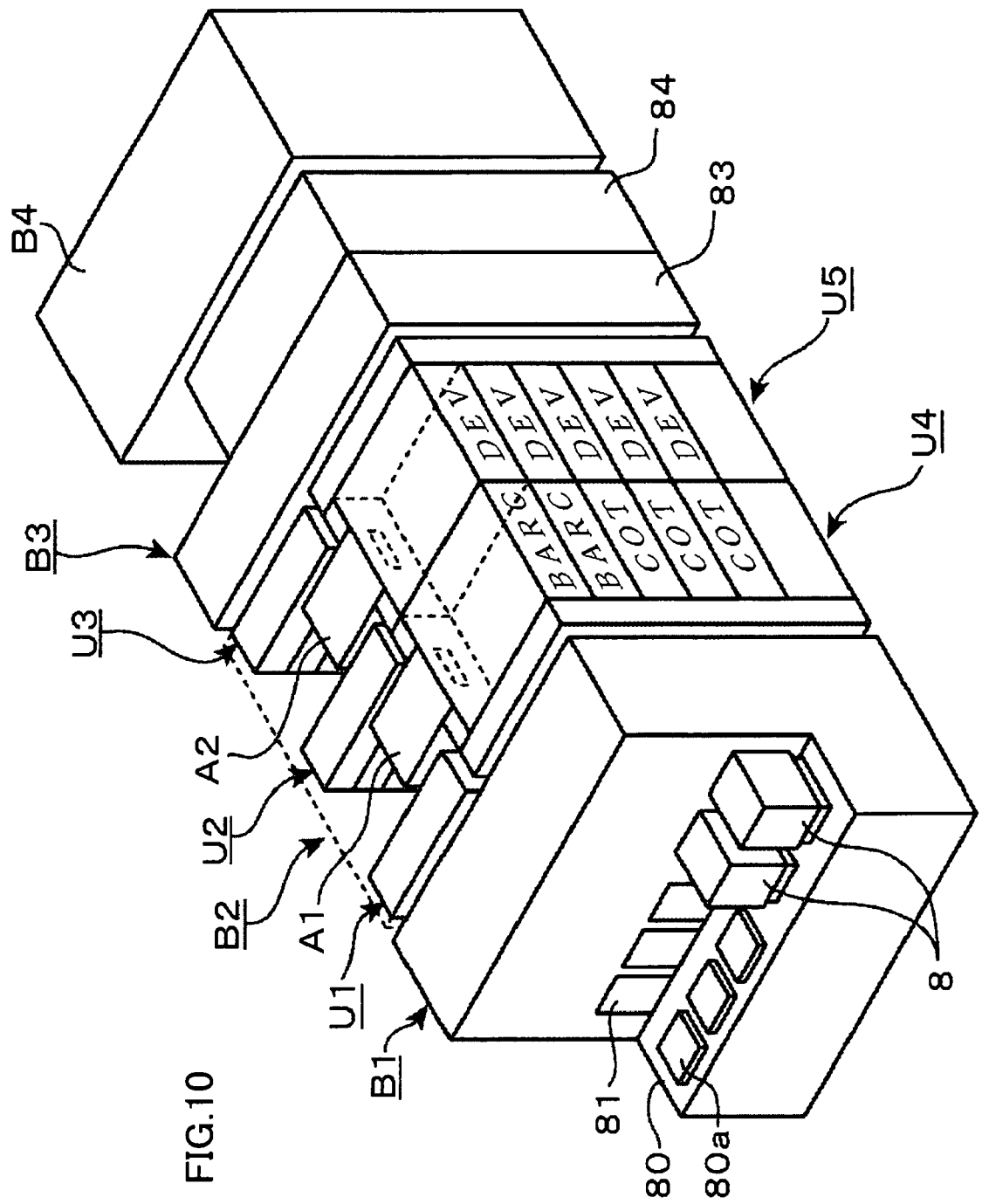
FIG. 10 is a perspective view showing an example of a coating and development apparatus incorporating the heating apparatus.
Figure 11:
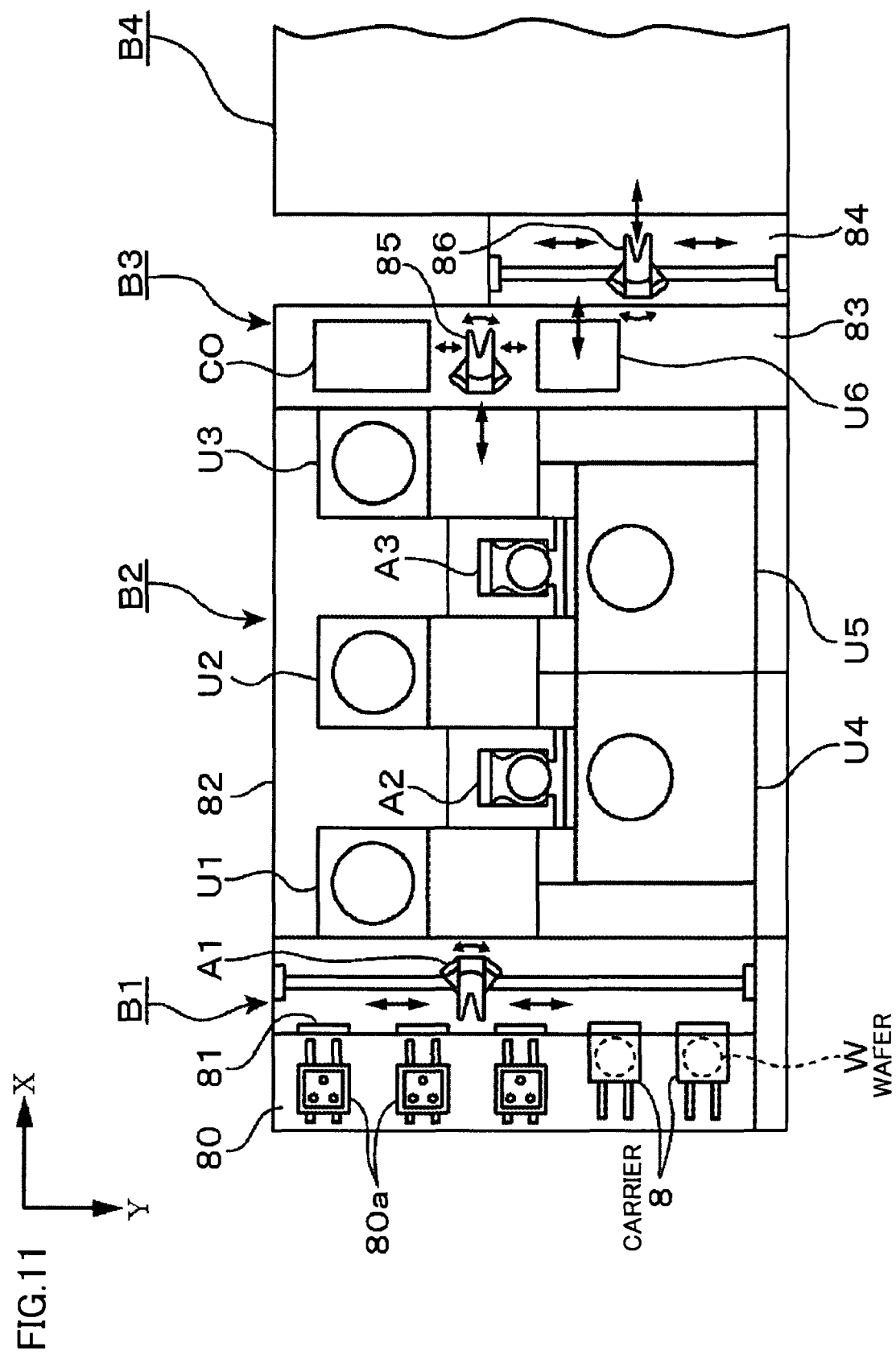
FIG. 11 is a plan view showing an example of the coating and development apparatus.

An overall structure of a resist pattern forming system obtained by connecting an exposure portion (exposure apparatus) to the coating and development apparatus incorporating heating apparatus 2 will now briefly be described with reference to FIGS. 10 and 11. FIGS. 10 and 11 show a carrier mount portion B1 for loading/unloading a carrier 8 that stores, in a sealed manner, for example, 13 substrates such as wafers W. Carrier mount portion B1 includes a carrier station 80 on which a plurality of mount portions 80a of carrier 8 can be arranged and mounted, an open/close portion 81 provided in a wall surface in the front when viewed from carrier station 80, and delivery means A1 for taking out wafer W from carrier 8 through open/close portion 81.

In the rear side of carrier mount portion B1, a treatment portion B2 surrounded by a housing 82 is connected. In treatment portion B2, successively from the front side, shelf units U1, U2 and U3 including heating/cooling-type units arranged in layers, and main transfer means A2, A3 for delivering wafer W among shelf units U1-U3 and liquid treatment units U4, U5 are alternately provided and arranged. Specifically, shelf units U1, U2 and U3 and main transfer means A2, A3 are arranged in line in a front-rear direction when viewed from carrier mount portion B1 and a not-shown opening for wafer transfer is formed at each connection location, so that wafer W can move freely from shelf unit U1 on one end side toward shelf unit U3 on the other end side within treatment portion B2.

Shelf units U1, U2 and U3 are structured by stacking various types of units for pre-treatment and post-treatment for treatment performed in liquid treatment units U4 and U5, in a plurality of layers, e.g., in 10 layers. Combination of units includes a delivery unit, a hydrophobic treatment unit (ADH), a temperature adjustment unit (CPL) for adjusting a temperature of wafer W to a prescribed temperature, a heating unit (BAKE) for heat treatment of wafer W before application of resist liquid, a heating unit (PAB) called a pre-baking unit or the like, for heat treatment of wafer W after application of resist liquid, a heating unit (POST) called a post-baking unit or the like, for heat treatment of wafer W after development treatment, and the like. Heating apparatus 2 according to the present invention is incorporated as the hydrophobic treatment unit (ADH).

In addition, as shown in FIG. 10, liquid treatment units U4, U5 are structured, for example, by stacking units such as an antireflection coating application unit (BARC), a coating unit (COT) applying resist liquid to wafer W, a development unit (DEV) performing development treatment by supplying a developer to wafer W, and the like, in a plurality of layers, e.g., in 5 layers.

An exposure portion B4 is connected to the rear of shelf unit U3 of treatment portion B2, with an interface portion B3 being interposed. Interface portion B3 is constituted of a first transfer chamber 83 and a second transfer chamber 84 that are provided, in front-rear relation, between treatment portion B2 and exposure portion B4, and the transfer chambers include a first transfer arm 85 and a second transfer arm 86 capable of movement upward/downward and pivot around a vertical axis as well as movement forward/backward, respectively. In addition, first transfer chamber 83 includes a shelf unit U6 in which, for example, the delivery unit, a high-precision temperature adjustment unit (CPL), a heating/cooling unit (PEB) for post-exposure baking treatment of wafer W, and the like are vertically stacked.

An exemplary flow of wafer W in such a resist pattern forming system will now be described. Wafer W in carrier 8 mounted on carrier mount portion B1 is transferred through a path of: the temperature adjustment unit (CPL), an antireflection coating forming unit (BARC), the heating unit (BAKE), the temperature adjustment unit (CPL), the coating unit (COLT), the heating unit (PAB), and the exposure portion B4, where exposure treatment is performed. Wafer W that has been subjected to exposure treatment is transferred through a path of: the heating unit (PEB), a high-precision temperature adjustment unit (CPL), the development unit (DEV), the heating unit (POST), the temperature adjustment unit (CPL), and carrier 8 of carrier mount portion B1.

The heating apparatus according to the present invention is applicable to units other than the hydrophobic treatment unit (ADH), such as BAKE, PAB, PEB, and POST. In addition, the present invention is also applicable to treatment, for example, of an LCD substrate and a mask substrate, in addition to treatment of a semiconductor wafer. Moreover, the present invention is also applicable as a heating apparatus included in the coating apparatus for applying an agent containing a precursor of an insulating film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heating apparatus comprising:
a heating chamber having a load/unload port of a substrate formed on one side;
a hot plate provided in said heating chamber, for heating the substrate from below;
a plurality of wires provided in a manner extending along a direction of transfer of the substrate and wound around pulleys provided at opposing ends of a transfer path of the substrate, for transferring the substrate between a cooling position of the substrate adjacent to the load/unload port of the heating chamber and a position above the hot plate;
a groove portion provided in a surface portion of the hot plate for passage of at least one of said plurality of wires; and
a gap forming member provided on said one wire for mounting the substrate, such that the substrate is in a state floating above the surface of the hot plate with a gap therefrom when the substrate is located above the hot plate; and
a drive mechanism for driving said plurality of wires on which the substrate is mounted only in a horizontal direction, wherein
said substrate loaded from outside to said cooling position is transferred only in the horizontal direction, subjected to heat treatment in the heating chamber while the substrate is mounted on said plurality of wires, and thereafter transferred only in the horizontal direction to return to said cooling position.

2. The heating apparatus according to claim 1, wherein said gap forming member serves to hold the substrate in a state floating above the hot plate with a gap of at most 0.5 mm therefrom.

3. The heating apparatus according to claim 1, wherein said gap forming member is formed to have a spherical shape and said wire passes through a central portion of the member.

4. The heating apparatus according to claim 1, wherein on said wire, a plurality of restriction members are provided along a contour of the substrate, in order to prevent displacement of the substrate by restricting an outer edge of the substrate.

5. The heating apparatus according to claim 1, wherein said wire is divided at a location on a lower side of the transfer path of the substrate, and an elastic member constantly applying restoring force in a direction of compression is provided between division locations.

6. The heating apparatus according to claim 1, wherein in said heating chamber, a top plate is provided and fixed, opposed to the hot plate.

7. The heating apparatus according to claim 6, wherein a distance between the hot plate and the top plate is set to at most 6 mm.

8. The heating apparatus according to claim 1, wherein a gas discharge port for discharging a gas is provided on a load/unload port side of the heating chamber, an exhaust port for exhausting the gas is provided on a side opposite to the load/unload port of the heating chamber, and when the substrate is subjected to heat treatment, airflow from the gas discharge port toward the exhaust port is formed.

9. The heating apparatus according to claim 8, wherein said gas is a gas for hydrophobic treatment of a surface of the substrate.

10. The heating apparatus according to claim 8, wherein a curtain with a gas is formed at the load/unload port of said heating chamber, for partition of atmosphere between inside and outside of the heating chamber.

11. The heating apparatus according to claim 8, wherein a shutter is formed at the load/unload port of said heating chamber, for partition of atmosphere between inside and outside of the heating chamber.

12. The heating apparatus according to claim 1, wherein in delivery of the substrate from an external substrate transfer mechanism holding a peripheral edge of the substrate to the gap forming member waiting at the cooling position, the external substrate transfer mechanism carrying said substrate is introduced to an upper side of the cooling position, moves from the upper side to a lower side of the cooling position while forming a space for passage of a pulley provided at one end of a substrate transfer path between said substrate transfer mechanism and the cooling position, delivers the substrate to the gap forming member, and returns from the lower side of the cooling position.

13. The heating apparatus according to claim 1, wherein a cooling plate is provided at said cooling position, and a groove portion is provided in a surface portion of the cooling plate for passage of at least one of the plurality of wires, and when the substrate is located above the cooling plate, the substrate is in a state floating above the surface of the cooling plate with a gap therefrom.

14. The heating apparatus according to claim 13, wherein a notch portion corresponding to a shape of an external substrate transfer mechanism is formed in a peripheral edge of said cooling plate, and in delivery of the substrate from the external substrate transfer mechanism holding a peripheral edge portion of the substrate to the gap forming member waiting on the cooling plate, the external substrate transfer mechanism carrying said substrate is introduced to an upper side of the cooling plate, moves from the upper side to a lower side of the cooling plate while forming a space for passage of a pulley provided at one end of a substrate transfer path between said substrate transfer mechanism and the cooling plate, delivers the substrate to the gap forming member, and returns from the lower side of the cooling plate.

15. A coating apparatus, comprising:
a carrier load/unload portion accommodating a substrate and loading/unloading a carrier;
a coating portion applying coating liquid to a surface of the substrate taken out from said carrier;
the heating apparatus according to claim 1 for performing heat treatment of the substrate for pre-treatment or post-treatment of coating treatment by the coating portion; and
a substrate transfer mechanism delivering the substrate to the heating apparatus; wherein
in delivery of the substrate to a gap forming member waiting at a cooling position, said substrate transfer mechanism is introduced to an upper side of the cooling position, moves from the upper side to a lower side of the cooling position while forming a space for passage of a pulley provided at one end of a substrate transfer path between said substrate transfer mechanism and the cooling position, delivers the substrate to the gap forming member, and returns from the lower side of the cooling position.

16. The coating apparatus according to claim 15, wherein a cooling plate is provided at said cooling position, a groove portion is provided in a surface portion of the cooling plate for passage of a wire, and when the substrate is located above the cooling plate, the substrate is in a state floating above the surface of the cooling plate with a gap therefrom, and a notch portion corresponding to a shape of the substrate transfer mechanism is formed in a peripheral edge of said cooling plate, and
said substrate transfer mechanism holds a peripheral edge of the substrate, and in delivery of the substrate to the gap forming member waiting on the cooling plate, the substrate transfer mechanism is introduced to an upper side of the cooling plate, moves from the upper side to a lower side of the cooling plate while forming a space for passage of the pulley provided at one end of the substrate transfer path between said substrate transfer mechanism and the cooling plate, delivers the substrate to the gap forming member, and returns from the lower side of the cooling plate.

17. A heating method, comprising the steps of:
mounting a substrate on a gap forming member provided on at least one wire at a cooling position from outside, by means of a plurality of wires provided in a manner extending along a direction of transfer of the substrate, while wound around pulleys provided at opposing ends of a transfer path of the substrate, between a heating chamber having a load/unload port of the substrate formed on one side and including a hot plate for heating the substrate from below and the cooling position of the substrate adjacent to the load/unload port;
positioning the substrate above the hot plate in a state floating above a surface of the hot plate with a gap therefrom by moving the one wire only in a horizontal direction toward the hot plate in such a manner as passing through a groove portion formed in a surface portion of the hot plate;
subjecting the substrate to heat treatment by using the hot plate while the substrate is mounted on the plurality of wires; and
thereafter transferring the substrate to the cooling position by moving the plurality of wires only in the horizontal direction to the cooling position, and cooling the substrate.

18. The heating method according to claim 17, wherein
said gap forming member serves to hold the substrate in a state floating above the hot plate with a gap of at most 0.5 mm therefrom.

19. The heating method according to claim 17, wherein
said gap forming member is formed to have a spherical shape and said wire passes through a central portion of the member.

20. The heating method according to claim 17, wherein
said substrate is transferred while an outer edge position of the substrate is restricted by a plurality of restriction members provided on the wire along a contour of the substrate.

21. The heating method according to claim 17, wherein
tension is applied to the wire as a result that an elastic member interposed at a location on a lower side of the transfer path of the substrate is constantly biased in a direction of compression.

22. The heating method according to claim 17, wherein
said substrate is subjected to heat treatment while a gas is fed from a gas discharge port provided on a side of the load/unload port of the heating chamber to an exhaust port provided on a side opposite to the load/unload port of the heating chamber.

23. The heating method according to claim 22, wherein
said gas is a gas for hydrophobic treatment of a surface of the substrate.

24. The heating method according to claim 22, wherein
when the substrate is subjected to heat treatment in said heating chamber, a curtain with a gas is formed at the load/unload port.

25. The heating method according to claim 22, wherein
when the substrate is subjected to heat treatment in said heating chamber, a shutter closes said load/unload port.

26. The heating method according to claim 17, wherein
in said step of transferring the substrate to the cooling position and cooling the substrate, the substrate is cooled in such a manner that the substrate is positioned in a state floating, with a gap, above the cooling plate having a groove portion provided in a surface portion for passage of the wire.

27. The heating method according to claim 26, wherein
a notch portion corresponding to a shape of an external substrate transfer mechanism is formed in a peripheral edge of said cooling plate, and
in said step of mounting a substrate on a gap forming member provided on a wire above said cooling plate from outside, the external substrate transfer mechanism holding a peripheral edge portion of the substrate is introduced to an upper side of the cooling plate, moves from the upper side to a lower side of the cooling plate while forming a space for passage of a pulley provided at one end of the substrate transfer path between the substrate transfer mechanism and the cooling plate, delivers the substrate to the gap forming member, and returns from the lower side of the cooling plate.

28. The heating method according to claim 17, wherein
in said step of mounting a substrate on a gap forming member provided on a wire at a cooling position from outside, the external substrate transfer mechanism holding a peripheral edge of the substrate is introduced to an upper side of the cooling position, moves from the upper side to a lower side of the cooling position while forming a space for passage of a pulley provided at one end of the substrate transfer path between the substrate transfer mechanism and the cooling position, delivers the substrate to the gap forming member, and returns from the lower side of the cooling.

29. A storage medium storing a computer program used in a heating apparatus structured to transfer a substrate between a heating chamber having a load/unload port of the substrate formed on one side, a hot plate provided in said heating chamber for heating the substrate from below, and a cooling position of the substrate adjacent to the load/unload port of the heating chamber and a position above the hot plate,
said computer program including the steps for performing the heating method according to claim 17.

* * * * *